United States Patent
Nicol et al.

(10) Patent No.: US 10,564,929 B2
(45) Date of Patent: Feb. 18, 2020

(54) COMMUNICATION BETWEEN DATAFLOW PROCESSING UNITS AND MEMORIES

(71) Applicant: Wave Computing, Inc., Campbell, CA (US)

(72) Inventors: Christopher John Nicol, Campbell, CA (US); Derek William Meyer, Truckee, CA (US)

(73) Assignee: Wave Computing, Inc., Campbell, CA (US)

( * ) Notice: Subject to any disclaimer, the term of this patent is extended or adjusted under 35 U.S.C. 154(b) by 255 days.

(21) Appl. No.: 15/665,631

(22) Filed: Aug. 1, 2017

(65) Prior Publication Data

US 2018/0060034 A1    Mar. 1, 2018

Related U.S. Application Data

(60) Provisional application No. 62/382,750, filed on Sep. 1, 2016.

(51) Int. Cl.
*G06F 5/10* (2006.01)
*G06F 13/16* (2006.01)
(Continued)

(52) U.S. Cl.
CPC ............ *G06F 5/10* (2013.01); *G06F 13/1663* (2013.01); *G06F 13/1673* (2013.01);
(Continued)

(58) Field of Classification Search
CPC .......... G06F 15/825; G06F 15/82; G06F 5/10; G06F 13/1663; G06F 13/1673;
(Continued)

(56) References Cited

U.S. PATENT DOCUMENTS 4,644,461 A * 2/1987 Jennings ............... G06F 9/4494
718/106
5,142,631 A   8/1992 Murray et al.
(Continued)

FOREIGN PATENT DOCUMENTS

WO    WO2009131569 A1    10/2009

OTHER PUBLICATIONS

Dataflow Machine Architecture by Arthur H. Veen (Year: 1987).*
(Continued)

*Primary Examiner* — Paul M Knight
(74) *Attorney, Agent, or Firm* — Adams Intellex, PLC

(57) ABSTRACT

A combination of memory units and dataflow processing units is disclosed for computation. A first memory unit is interposed between a first dataflow processing unit and a second dataflow processing unit. Operations for a dataflow graph are allocated across the first dataflow processing unit and the second dataflow processing unit. The first memory unit passes data between the first dataflow processing unit and the second dataflow processing unit to execute the dataflow graph. The first memory unit is a high bandwidth, shared memory device including a hybrid memory cube. The first dataflow processing unit and second dataflow processing unit include a plurality of circular buffers containing instructions for controlling data transfer between the first dataflow processing unit and second dataflow processing unit. Additional dataflow processing units and additional memory units are included for additional functionality and efficiency.

23 Claims, 11 Drawing Sheets

(51) Int. Cl.
*G06F 15/82* (2006.01)
*G11C 19/00* (2006.01)
*G06N 20/00* (2019.01)
*G06F 13/40* (2006.01)

(52) U.S. Cl.
CPC ............. *G06N 20/00* (2019.01); *G11C 19/00* (2013.01); *G06F 13/4022* (2013.01); *G06F 15/82* (2013.01)

(58) Field of Classification Search
CPC .. G06F 13/4022; G06N 20/00; G06N 3/0454; G11C 19/00
See application file for complete search history.

(56) References Cited

U.S. PATENT DOCUMENTS

| | | | |
|---|---|---|---|
| 5,226,131 A * | 7/1993 | Grafe | G06F 9/32 712/201 |
| 5,325,493 A * | 6/1994 | Herrell | G06F 15/8007 712/201 |
| 5,465,368 A * | 11/1995 | Davidson | G06F 9/4494 712/27 |
| 6,026,485 A * | 2/2000 | O'Connor | G06F 9/30021 712/226 |
| 6,134,605 A | 10/2000 | Hudson et al. | |
| 6,363,470 B1 | 3/2002 | Laurenti et al. | |
| 7,085,850 B2 * | 8/2006 | Calvignac | H04L 29/06 370/389 |
| 7,420,390 B1 | 9/2008 | Hutton et al. | |
| 7,680,962 B2 * | 3/2010 | Anjo | G06F 15/7867 709/212 |
| 8,078,839 B2 | 12/2011 | Fant | |
| 8,314,636 B2 | 11/2012 | Hutton et al. | |
| 8,341,469 B2 | 12/2012 | Miyama et al. | |
| 8,493,974 B1 | 7/2013 | Nelson et al. | |
| 9,128,817 B2 | 9/2015 | Kim et al. | |
| 9,330,060 B1 * | 5/2016 | Tsang | H04N 19/43 |
| 2002/0167337 A1 | 11/2002 | Chelcea et al. | |
| 2007/0133399 A1 | 6/2007 | Gangwal | |
| 2008/0168303 A1 | 7/2008 | Spear et al. | |
| 2009/0089605 A1 | 4/2009 | Westwick et al. | |
| 2010/0013517 A1 | 1/2010 | Manohar et al. | |
| 2010/0281448 A1 | 11/2010 | He | |
| 2011/0199117 A1 | 8/2011 | Hutchings et al. | |
| 2012/0119781 A1 | 5/2012 | Manohar et al. | |
| 2012/0235839 A1 | 9/2012 | Mazumdar et al. | |
| 2012/0319730 A1 | 12/2012 | Fitton et al. | |
| 2012/0323549 A1 * | 12/2012 | Bashteen | G06F 17/5045 703/14 |
| 2013/0009666 A1 | 1/2013 | Hutton et al. | |
| 2013/0009667 A1 | 1/2013 | Calhoun et al. | |
| 2013/0043902 A1 | 2/2013 | Rahim et al. | |
| 2014/0075144 A1 | 3/2014 | Sanders et al. | |
| 2014/0223462 A1 | 8/2014 | Aimone et al. | |
| 2015/0324690 A1 | 11/2015 | Chilimbi et al. | |
| 2015/0339570 A1 | 11/2015 | Scheffler | |
| 2016/0180239 A1 | 6/2016 | Frankel et al. | |

OTHER PUBLICATIONS

Synchronous Data Flow by Edward Lee (Year: 1987).*
Isomorphisms Between Petr Nets and Dataflow Graphs by Kavi (Year: 1987).*
Preliminary Architecture for a Basic Data-Flow Processor by Jack B. Dennis (Year: 1975).*
Encyclopedia of Parallel Computing section on Data Flow Computer Architecture by Jack B Dennis (Year: 2011).*
International Search Report dated Feb. 6, 2015 for PCT/US2014/063591.
Stratix II Device Handbook, vol. 1, published by Altera Corporation © May 2007.
Hybrid Memory Cube Specification 2.1, published by Altera Corporation © Nov. 2014.
J. Thomas Pawlowski, Hybrid Memory Cube, published by Micron Technology Inc. © Aug. 4, 2011.

* cited by examiner

COMMUNICATION BETWEEN DATAFLOW PROCESSING UNITS AND MEMORIES

RELATED APPLICATIONS

This application claims the benefit of U.S. provisional patent application "Communication between Dataflow Processing Units and Memories" Ser. No. 62/382,750, filed Sep. 1, 2016. The foregoing application is hereby incorporated by reference in its entirety.

FIELD OF ART

This application relates generally to computation and more particularly to communication between dataflow processing units and memories.

BACKGROUND

Modern integrated circuits or "chips" perform a wide variety of functions in the electronic systems with which people interact daily. The chips are a result of highly complex circuit designs, architectures, and implementations, and are integral to electronic systems for providing communications, computing, and networking, whether the electronic systems have applications for business, entertainment, or consumer electronics. The electronic systems routinely contain more than one chip, and the chips perform such critical functions as computation, storage, and control. The chips are used to compute algorithms and heuristics, handle data, communicate internally and externally to the electronic system, and so on, in support of the purposes of the electronic systems. Since there are so many computations that must be performed, any improvements made in the efficiency of the computations add up to a large impact on overall system performance. As the amount of data to be handled increases, the approaches that are used to compute and handle the data must be not only effective, efficient, and economical, but must also scale as the amount of data increases.

Technological advances in integrated circuit manufacturing processes enable the production of integrated electronic systems comprising tens of millions, hundreds of millions, or an even greater number of active devices. The active devices contained in an integrated circuit include transistors (bipolar, FET, etc.), diodes, optoelectronic devices, and so on. Increased numbers of insulation and interconnection layers serve to further expand opportunities for complex data paths and more powerful control schemes. As a result, the demand for advanced integrated circuits has driven the development and production of circuits with increased electronic system performance, decreased device size, and greater system feature sets, among many other benefits. One direct result of technological and systemic improvements is an ever-increasing trend towards design complexity. The design complexity of the electronic systems creates difficult engineering challenges surrounding circuit design, system implementation and control, chip fabrication, and the like. This complexity demands increased and meticulous scrutiny of logic circuits, interconnection schemes, systems architectures, and system control. New fabrication technologies, system architectures, and circuit families have been developed which are capable of taking advantage of reduced total device count, smaller device sizes, and simplified wiring/control schemes (e.g. datapaths/control paths). Each circuit family provides its own engineering tradeoffs and requires careful design considerations.

Two broad categories of electronic circuits are used in the construction of integrated circuits. These circuit categories include static circuits and dynamic circuits. Both static and dynamic circuits are used to form the basis of many types of electronic circuits including digital logic, memories, communications circuits, analog circuits, programmable devices, and so on. Static circuits are used primarily in applications where signal integrity and system robustness take priority over other design criteria, such as circuit density and power consumption. In contrast, dynamic circuits are applied where system performance and circuit density are critical. Portable and personal electronic devices such as smartphones, PDAs, tablets, and personal computers, among others require memory and microprocessor circuits with high circuit density, high system performance, extensive feature sets, and low power consumption, to name a few requirements. In order to ensure that the integrated circuits and the systems that contain them will operate properly, testing is performed at many points in the design and fabrication processes. The testing includes circuit modeling and simulation, chip fabrication verification, and so on. The simulation, modeling, and verification are highly computationally intensive because of the extreme complexity and density of the circuits and systems. Efficiency and efficacy are key factors to the success and cost effectiveness of the many manufacturing steps, testing procedures, and processes.

SUMMARY

Disclosed embodiments provide for improving data handling performance by enhancing communication between dataflow processing units and memories. A first memory unit is interposed between a first dataflow processing unit and a second dataflow processing unit. A first plurality of circular buffers is included in the first dataflow processing unit. The circular buffers contain instructions for controlling data transfer between the first dataflow processing unit and the second dataflow processing unit. The first memory unit can include a hybrid memory cube (HMC). Operations for a dataflow graph are allocated across the first dataflow processing unit and the second dataflow processing unit. The first memory unit passes data between the first dataflow processing unit and the second dataflow processing unit to execute the dataflow graph. The first memory unit includes a high bandwidth memory, where the first memory unit includes a hybrid memory cube. The first memory unit is a shared memory device, and is shared at least between the first dataflow processing unit and the second dataflow processing unit.

Data processing of large amounts of unstructured data has found many applications in areas such as artificial intelligence, machine learning including deep learning, and so on. To process the large amounts of data required for machine learning, designers can turn to options such as building or buying faster processors, designing custom integrated circuits (chips), or implementing application specific integrated circuits (ASIC), etc. These approaches are based on computer and chip architectures that are focused on how control of the chip operations (control flow) is performed, rather that the flow of data through the chips. In a control flow architecture, the order of instructions, functions, and subroutines is determined. In a dataflow architecture, the execution of instructions, functions, subroutines, etc. is based on the presence or absence of data. This latter approach, that of dataflow, is better suited to handling the large amounts of unstructured data that is processed as part of the learning applications.

An apparatus for computation is disclosed comprising: a first dataflow processing unit; a second dataflow processing unit; a first plurality of circular buffers, wherein the first plurality of circular buffers is included in the first dataflow processing unit and contains instructions for controlling data transfer between the first dataflow processing unit and the second dataflow processing unit; and a first memory unit interposed between the first dataflow processing unit and the second dataflow processing unit wherein operations for a dataflow graph are allocated across the first dataflow processing unit and the second dataflow processing unit and wherein the first memory unit passes data between the first dataflow processing unit and the second dataflow processing unit to execute the dataflow graph.

Embodiments include a computer-implemented method for processing implementation comprising: designing a processor arrangement comprising: a first dataflow processing unit; a second dataflow processing unit; a first plurality of circular buffers, wherein the first plurality of circular buffers is included in the first dataflow processing unit and contains instructions for controlling data transfer between the first dataflow processing unit and the second dataflow processing unit; and a first memory unit interposed between the first dataflow processing unit and the second dataflow processing unit wherein operations for a dataflow graph are allocated across the first dataflow processing unit and the second dataflow processing unit and wherein the first memory unit passes data between the first dataflow processing unit and the second dataflow processing unit to execute the dataflow graph.

Various features, aspects, and advantages of various embodiments will become more apparent from the following further description.

BRIEF DESCRIPTION OF THE DRAWINGS

The following detailed description of certain embodiments may be understood by reference to the following figures wherein.

DETAILED DESCRIPTION

Figure 1:
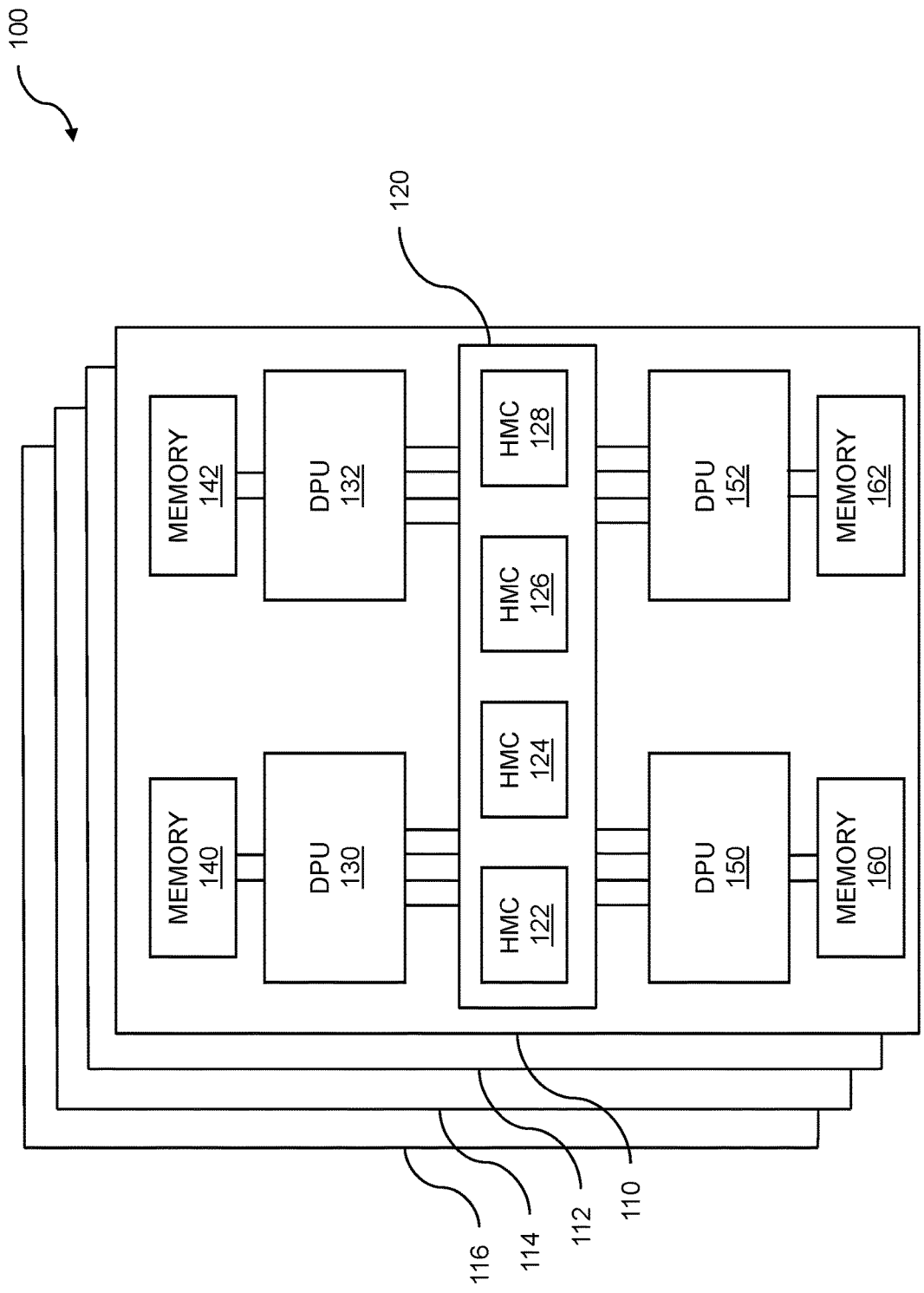
FIG. 1 illustrates dataflow processing units with a hybrid memory cube (HMC).

The electronics industry is driven by commercial, military, and other market segments to improve the semiconductor chips and systems that it designs, develops, and fabricates. Improvement of the semiconductor chips is measured based on many factors including design criteria such as size, speed, power consumption, heat dissipation, feature sets, compatibility, etc. The improvements find their way into designs of the semiconductor chips and the capabilities of the electronic systems that are built from the chips. The semiconductor chips and systems are deployed in many market-driven and consumer-driven applications. The applications include computation, digital communications, control and automation, etc., naming only a few. The abilities of the chips to perform basic logical operations and to process data, at high speed, are fundamental to any of the chip and system applications. The abilities of the chips to process very large data sets have become particularly critical due to the demands of applications such as artificial intelligence and machine learning, the latter of which can include deep learning.

Chip, system, and computer architectures have traditionally relied on controlling the flow of data through the chip, system, or computer. In these architectures, such as the classic von Neumann architecture, a set of instructions is executed to process data. With such "control flow" architectures, the execution of the instructions can be predicted and can be deterministic. That is, the way in which data is processed is dependent upon the point at which a chip, system, or computer is operating in a set of instructions. In contrast, a "dataflow" architecture is one in which the data controls the order of operation of the chip, system, or computer. The dataflow control can be determined by the presence or absence of data. Dataflow architectures find applications in many areas including the fields of networking and digital signal processing, as well as other areas in which large data sets must be handled such as telemetry and graphics processing.

High speed memory can be applied to improve communication between specialized dataflow processing units. Since communication such as the transfer of data from one location to another location can be a limiting factor to chip and system performance, increased communication rate and efficiency can directly impact speed. A first memory unit is interposed between a first dataflow processing unit and a second dataflow processing unit. Operations of a dataflow graph are allocated across the first dataflow processing unit and the second dataflow processing unit. The first memory unit passes data between the first dataflow processing unit and the second dataflow processing unit to execute the dataflow graph. The first memory unit comprises a high bandwidth memory and is a shared memory device such as a hybrid memory cube (HMC). Multiple address ports can be realized in the high-speed memory to implement higher bandwidth and additional functionality. For example, multiple virtual first-in-first-out (FIFO) buffers can be realized in high speed memory more efficiently using multiple address ports.

An agent executing in software on each processing element can interact with dynamically established FIFO buffers to coordinate the flow of data. The size of each FIFO may be created at run-time based on latency and/or synchronization requirements for a particular application. Registers within each processing element track the starting address and ending address of each FIFO. In cases where there is no data present in a FIFO, a processing element can enter a sleep mode to save energy. When valid data arrives in a FIFO, a sleeping processing element can wake to process the data.

Based on the data consumption and production rates of each processing element, an additional FIFO may be established between two processing elements. In some cases, a processing element may produce small amounts of data at low intervals, in which case no FIFO may be needed, and the processing element can send the data directly to another processing element. In other cases, a processing element may produce large amounts of data at frequent intervals, in which case an additional FIFO can help streamline the flow of data. This can be particularly important with bursty data production and/or bursty data consumption. In some embodiments, the data may be divided into blocks of various sizes. Data blocks above a predetermined threshold may be deemed as large blocks. For example, blocks greater than 512 bytes may be considered large blocks in some embodiments. Large data blocks may be routed amongst processing elements through FIFOs implemented as a memory element in external memory, while small data blocks (less than or equal to the predetermined threshold) may be passed amongst processing elements directly into onboard circular buffers without requiring a FIFO.

The FIFO size can include a width that is variable. In some cases, the FIFO entry width can vary on an entry-by-entry basis. Depending on the type of data read from and written to the FIFO, a different width can be selected in order to optimize FIFO usage. For example, 8-bit data would fit more naturally in a narrower FIFO, while 32-bit data would fit more naturally in a wider FIFO. The FIFO width may also account for tags, metadata, pointers, and so on. The width of the FIFO entry can be encoded in the data that will flow through the FIFO. In this manner, the FIFO size may change in width based on the encoding. In embodiments, the FIFO size includes a variable width. In embodiments, the width is encoded in the data flowing through the FIFO.

In an environment with multiple processing elements, data from a first processing element is sent to two downstream processing elements simultaneously as part of a forking operation. A FIFO can be configured between a first processing element and downstream processing elements. Each downstream processing element can access the FIFO independently. The consumption rate of each downstream FIFO may differ. Data signals may be sent between the first processing element and the downstream processing elements to coordinate the data exchange with the FIFO. Alternatively, each downstream processing element can have its own dedicated FIFO. Thus, the first processing element sends data to one FIFO that is associated with one of the downstream processing elements, and sends the data to another FIFO that corresponds to a different downstream processing element. In this way, there is additional flexibility in the forking operation in terms of data consumption and production rates of the various processing elements.

The forking operation within a network of processing elements enables improved efficiency. It serves to minimize the amount of down time for processing elements by increasing the parallelism of the computations, allowing the processing elements to continue producing and/or consuming data as much as possible during operation of the multiple processing element computer system. In a related manner, processing elements can realize a joining operation. Joining allows the output stream of two or more processing elements to be merged into a single, combined data stream for further downstream consumption. Joining serves to likewise increase parallelism and efficiency of a dataflow graph processing system.

FIG. 1 illustrates dataflow processing units with hybrid memory cubes (HMC). A first memory unit can be interposed between a first dataflow processing unit (DPU) and a second dataflow processing unit to improve communication between dataflow processing units and memories. Operations for a dataflow graph can be allocated across the first dataflow processing unit and the second dataflow processing unit. The first memory unit can pass data between the first dataflow processing unit and the second dataflow processing unit to execute the dataflow graph. The dataflow is controlled with instructions contained in circular buffers. Illustration 100 includes dataflow processing units (DPUs) 130, 132, 150, and 152, memories (e.g. DDR4) 140, 142, 160, and 162, and hybrid memory cube (HMC) 120. The dataflow processor 110 elements can be coupled to process large amounts of data including unstructured data. Additional dataflow processing elements can be coupled to dataflow processor 110 and are shown in a three-dimensional view as processors 112, 114, and 116 behind dataflow processor 110. The processing of the unstructured data can be used for such purposes as artificial intelligence, machine learning, deep learning, etc. The dataflow processor 110 can execute a dataflow graph. HMC 120 can be a composite HMC and include multiple discrete HMCs such as HMC 122, HMC 124, HMC 126, and HMC 128. Multiple HMCs 122, 124, 126, and 128 can comprise a single, logical HMC 120. The aforementioned first memory unit can be a shared memory device. The shared memory device can be a dual-port memory, a multi-port memory, a FIFO, a buffer, a circular buffer, etc. The first memory unit can include a high bandwidth memory. A high bandwidth memory can include a hybrid memory cube or other fast memory architecture for handling of large amounts of structured and unstructured data.

The first dataflow processing unit (DPU) can include a first plurality of circular buffers containing instructions for controlling data transfer between the first dataflow processing unit and the second dataflow processing unit using the first memory unit. The instructions that can be contained in the circular buffers can be loaded, modified, overwritten, etc., based on applications such as the types of data being processed by DPUs, on dataflow graphs (DFG), and so on. Similarly to the first DPU, the second DPU can include circular buffers. The second dataflow processing unit can include a second plurality of circular buffers containing instructions for controlling data transfer between the first dataflow processing unit and the second dataflow processing unit using the first memory unit. The instructions contained in the circular buffers can be specific to a given application of data processing, dataflow graph, etc. The given application can comprise one or more software agents that run on the processing elements of the DPUs.

The first dataflow processing unit can be coupled to the first memory unit via a first link. The link can be a high-speed link and can include one or more bits, bytes, and so on, for data, control, etc. The links can be unidirectional and bidirectional. The first dataflow processing unit can use a write port within the first link to send data to the first memory unit. The write port can be a bit, byte, or other appropriate width. The second dataflow processing unit can be coupled to the first memory unit via a second link. The second link can be a high-speed link and can be a bit, byte, or other width, can be unidirectional and bidirectional, etc. The second dataflow processing unit can use a read port within the second link to receive data from the first memory unit. The first link and the second link can operate simultaneously. The first link can access a plurality of FIFOs within the first memory unit. The FIFOs can be used for buffering data transfers, retiming data transfers, and so on. The second link can access a plurality of FIFOs within the first memory unit. The pluralities of FIFOs can overlap, can be separate pluralities (e.g. disjoint sets), and so on. The pluralities of FIFOs can be configured using DRAM memory. The pluralities of FIFOs can be configured for block transfers of data, collecting data before an event, collecting data after an event, etc. The pluralities of FIFOs each can have an address pointer to sequence through a FIFO from the plurality of FIFOs. Data that can be transferred to the plurality of FIFOs can be stored across the plurality of FIFOs, such as with banding, to increase the bandwidth of a data transfer. The plurality of FIFOs can be statically defined, where the statically defining can be based on programming. Programming instructions can be used to control the operations of the plurality of FIFOs. Definition for the plurality of FIFOs can be accomplished at compile time based on the dataflow graph. The definition for the plurality of FIFOs can change based on adapting the dataflow graph, recompiling, etc. The plurality of FIFOs can be determined at runtime based on module availability in a library. A library of available FIFOs can be maintained. The FIFOs that can be defined can be based on the FIFOs that are available at the time of the definition of the FIFOs.

Other configurations of DPUs and memories can be configured. A third dataflow processing unit can be coupled to the first memory unit wherein the third dataflow processing unit accesses the first memory unit through a third link. The third link can have a read port, a write port, and so on. A fourth dataflow processing unit can be coupled to the first memory unit wherein the fourth dataflow processing unit can access the first memory unit through a fourth link. As for the first, second, and third links, the fourth link can have a read port, a write port, and so on. A second memory unit can be interposed between the first dataflow processing unit and the second dataflow processing unit. The second memory can be a shared memory and can be a high bandwidth memory such as a hybrid memory cube (HMC). Some applications can handle large amounts of data including unstructured data. The data processing requirements of the data can require further additions of memories, processors, communications links, etc. A third memory unit can be interposed between the first dataflow processing unit and the second dataflow processing unit. In some embodiments, a fourth memory unit can be interposed between the first and second dataflow processing units. Increased switching capabilities can be added between the dataflow processing units and the memories, such as crossbar switches to increase bandwidth. In other embodiments, additional DPUs can be added including a third dataflow processing unit and a fourth dataflow processing unit. Further additions of DPUs can be application dependent. Each of the first memory unit, the second memory unit, the third memory unit, and the fourth memory unit can access the first dataflow processing unit, the second dataflow processing unit, the third dataflow processing unit, and the fourth dataflow processing unit on different links. As before, the links can have a read port, a write port, control, and so on. The first dataflow processing unit, the second dataflow processing unit, and the first memory unit comprise a deep learning machine, an artificial intelligence machine, a machine learning machine, and so on.

Embodiments include a processor-implemented method for computation comprising: obtaining data from a first dataflow processing unit, wherein the first dataflow processing unit includes a plurality of circular buffers containing instructions to control dataflow; sending the data from the first dataflow processing unit through a first memory unit interposed between the first dataflow processing unit and a second dataflow processing unit wherein operations for a dataflow graph are allocated across the first dataflow processing unit and the second dataflow processing unit and wherein the first memory unit passes data between the first dataflow processing unit and the second dataflow processing unit to execute the dataflow graph; and receiving the data into the second dataflow processing unit.

Figure 2:
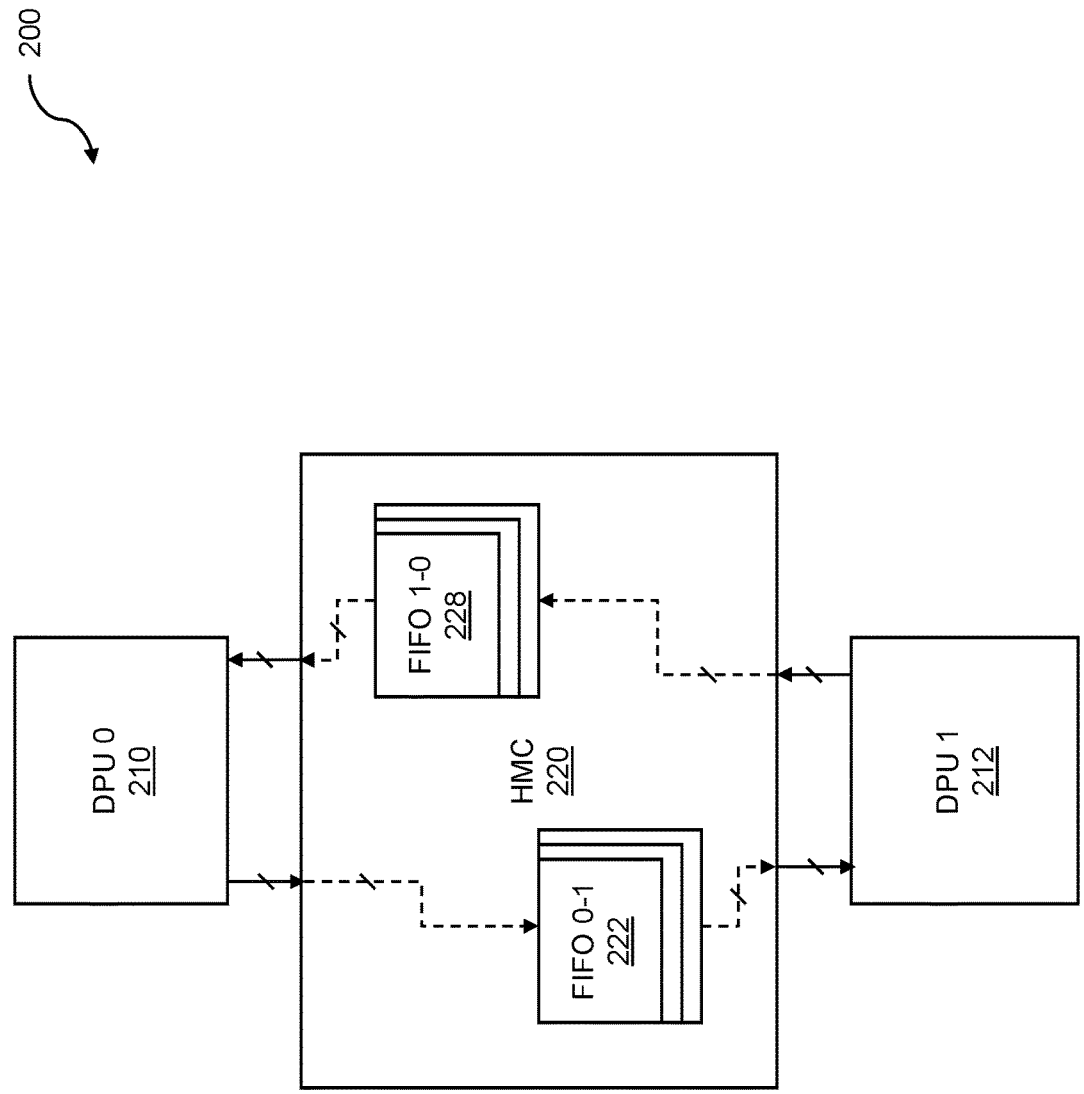
FIG. 2 shows dataflow processing units and a shared HMC.

FIG. 2 shows dataflow processing units and shared HMC. A first memory unit can be interposed between a first dataflow processing unit and a second dataflow processing unit to improve communication between dataflow processing units and memories. Operations for a dataflow graph can be allocated across the first dataflow processing unit and the second dataflow processing unit. The first memory unit can pass data between the first dataflow processing unit and the second dataflow processing unit to execute the dataflow graph. In dataflow processor 200, a first dataflow processing unit 210 and a second dataflow processing unit 212 can share a first memory unit such as a hybrid memory cube 220. The DPUs 210 and 212 can be used for processing large amounts of unstructured data, where the processing can be used for such applications as artificial intelligence, machine learning, deep learning, and so on. The HMC can include first-in first-out (FIFO) memories such as 222 and 228. The FIFOs can be used for buffering, controlling, etc. communication between the dataflow processing units and HMC memories, shared memories, high bandwidth memories, and so on.

FIFOs 222 and 228 can be dynamically allocated within the address space of the HMC by DPU 210 and/or DPU 212. The FIFOs can be allocated based on the needs of a given application, or an agent(s) used to implement the application. One or more FIFOs can be allocated for each DPU. The FIFOs can be addressed using multiple address ports, which can implement pointers within the FIFO. FIFOs can be used to facilitate forking agents, joining agents, and the like. HMC 220 can comprise multiple discrete HMCs in one logical HMC or can be a single, discrete HMC. Dataflow into and out of the FIFOs can be controlled by one or more DPUs. The DPUs are controlled by one or more circular buffers that have been statically scheduled.

Figure 3:
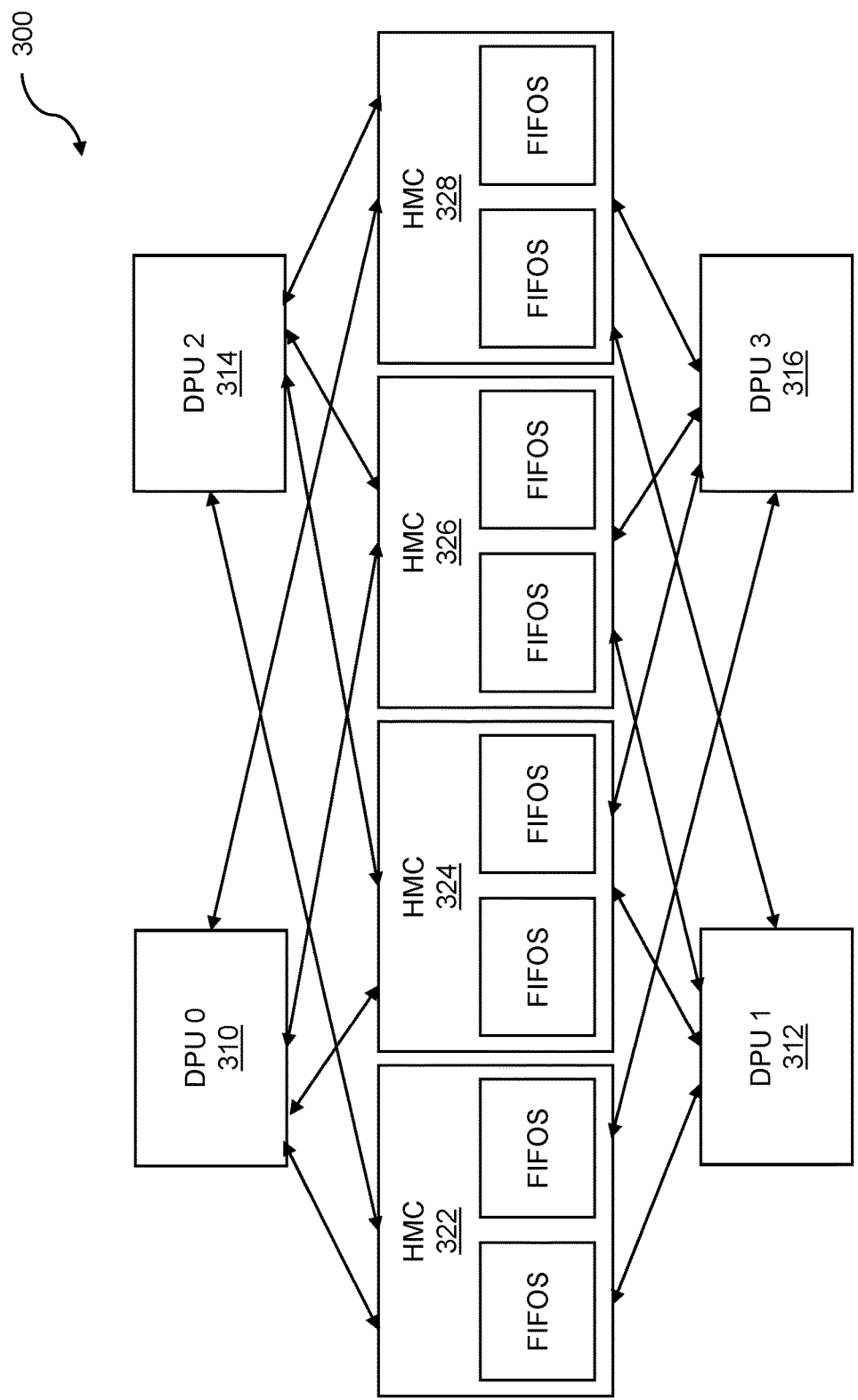
FIG. 3 illustrates multiple data processing units (DPUs) and multiple HMCs.

FIG. 3 illustrates multiple DPUs and multiple HMCs for communicating. A first memory unit can be interposed between a first dataflow processing unit and a second dataflow processing unit to improve communication between dataflow processing units and memories. Operations for a dataflow graph can be allocated across the first dataflow processing unit and the second dataflow processing unit. The first memory unit can pass data between the first dataflow processing unit and the second dataflow processing unit to execute the dataflow graph. Multiple dataflow processing units 310, 312, 314, and 316 can share and communicate with hybrid memory cubes 322, 324, 326, and 328. While four DPUs and four HMCs are shown, other numbers of DPUs and HMCs can be coupled. The DPUs can communicate with one or more HMCs through direct connections, through switches, through crossbar switches, and so on. The connections between a given DPU and a given HMC can be a link. A link can include a read port and a write port. In example 300, all combinations of DPU pairs, DPU 0 and DPU 1, DPU 0 and DPU 2, DPU 0 and DPU 3, DPU 1 and DPU 2, DPU 1 and DPU 3, and DPU 2 and DPU 3 can have their communications facilitated through HMC 322, HMC 324, HMC 326, and HMC 328. The communications can be facilitated using FIFOs allocated within the HMCs. Multiple FIFOs and/or FIFO pairs can be allocated to facilitate all the combinations of DPU communication. Example 300 can illustrate a dataflow processor or a reconfigurable fabric.

Figure 4:
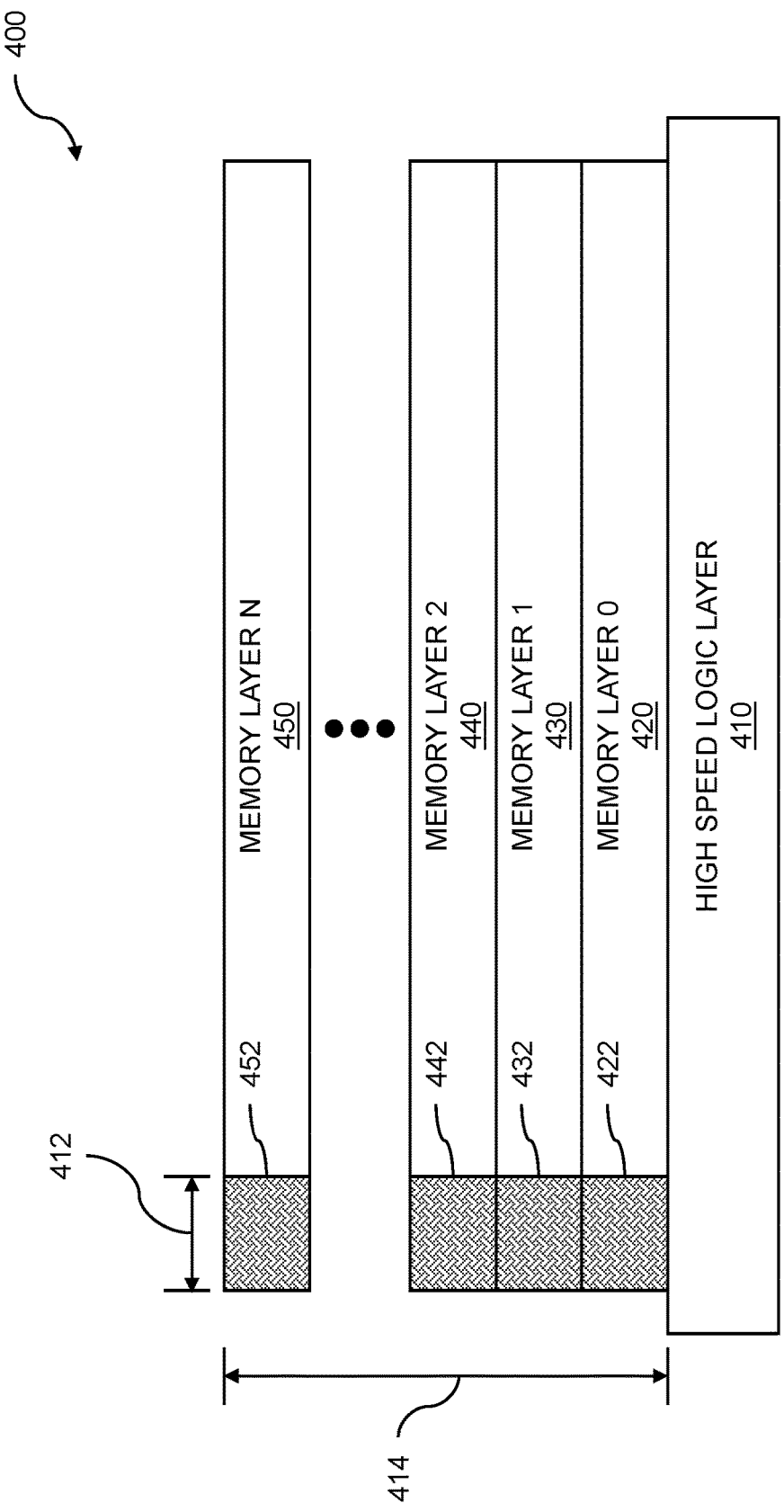
FIG. 4 is an example illustrating basic HMC structure with partitions and vaults.

FIG. 4 is an example illustrating basic HMC structure with partitions and vault. A first memory unit can be interposed between a first dataflow processing unit and a second dataflow processing unit to improve communication between dataflow processing units and memories. Operations for a dataflow graph can be allocated across the first dataflow processing unit and the second dataflow processing unit. The first memory unit can pass data between the first dataflow processing unit and the second dataflow processing unit to execute the dataflow graph. A hybrid memory cube structure 400 can provide a high bandwidth memory for sharing data between processors including dataflow processing units. The HMC 400 can be a multichip module, a multilayer chip, and so on. The HMC can include a high-speed logic layer 410. The high-speed logic layer can communicate between the HMC and other memories such as double data rate (DDR) type memories, processors, dataflow processing units, and so on. The high-speed logic layer 410 can use through silicon vias (TSV) to communicate with vault control logic 414, where the vault control logic can include partitions 412. Each partition can control a memory layer. In this example, partition 422 can control memory layer 0 420, partition 432 can control memory layer 1 430, partition 442 can control memory layer 2 440, partition 452 can control memory layer N 450, and so on. A vault controller can have a queue for buffering references for memory controlled by the vault. A vault controller can control its timing requirements.

Figure 5:
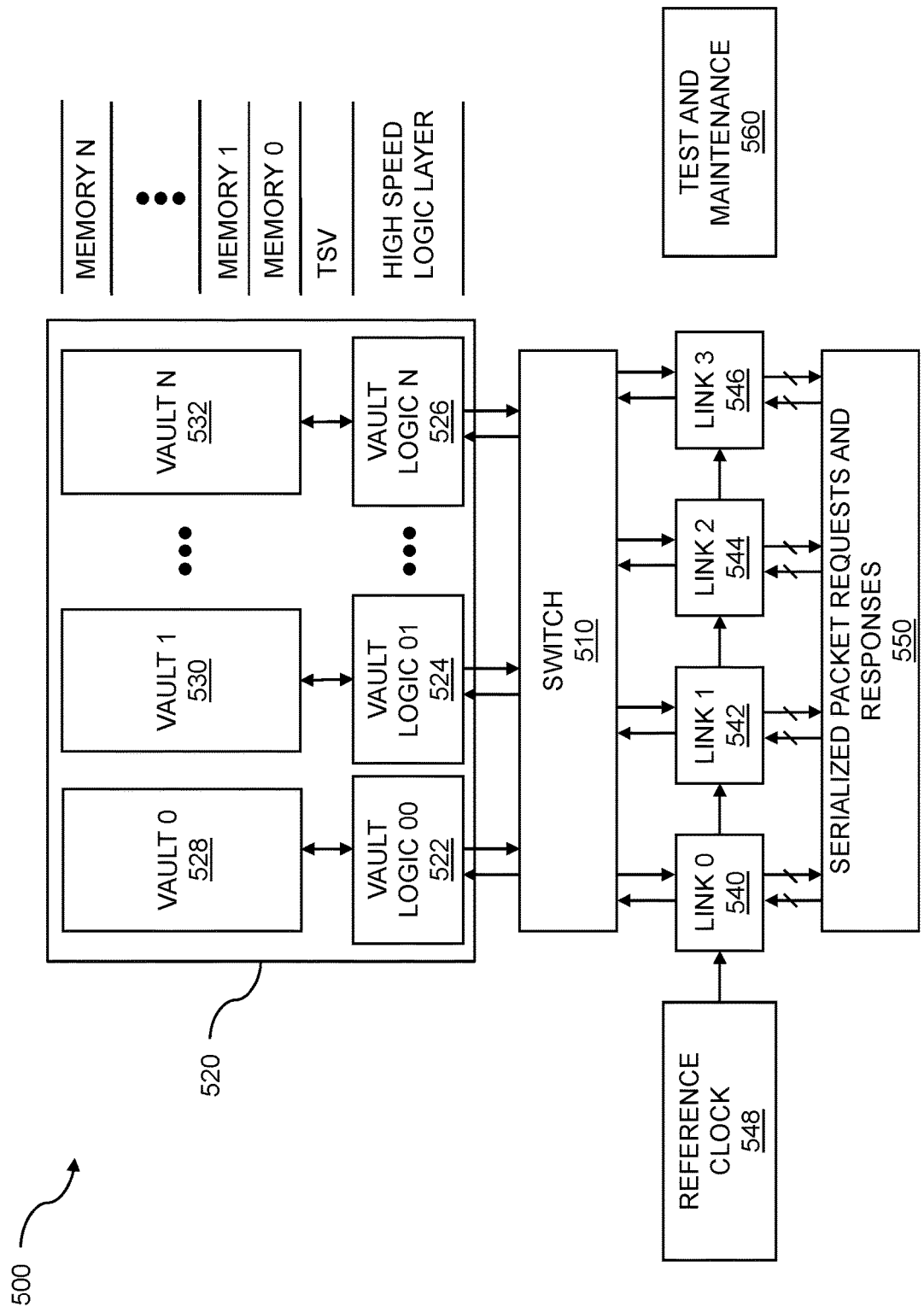
FIG. 5 is an example showing basic HMC architecture.

FIG. 5 is an example showing basic HMC architecture. A first memory unit can be interposed between a first dataflow processing unit and a second dataflow processing unit to improve communication between dataflow processing units and memories. Operations for a dataflow graph can be allocated across the first dataflow processing unit and the second dataflow processing unit. The first memory unit can pass data between the first dataflow processing unit and the second dataflow processing unit to execute the dataflow graph. A basic hybrid memory cube architecture 500 can include a switch 510. The switch 510 can be connect links such as links 540, 542, 544, and 546 to a hybrid memory cube 520. The switch 510 can be a crossbar switch, a matrix switch, a cross-point switch, and so on. The switch 510 can be bidirectional. The links 540 through 546 can be bidirectional, single-bit, multi-bit, and so on. The links can be used to transfer serialized packet requests and responses 550 through switch 510 to HMC 520. A reference clock 548 can be used for timing and control of links 540 through 546. Test and maintenance 560 can be used to verify operation of an HMC architecture, to setup the HMC, etc.

The hybrid memory cube 520 can include a high-speed logic layer that can be coupled to through silicon vias (TSV) to various layers of memory circuits, such as memory circuits memory 0 through memory N. Typical values for N can be 4, 8, etc. The high-speed logic layer can include vault logic such as vault logic 522, 524, and 526. The vault logic 522 through 526 can be used to control and communicate with memory vaults such as vaults 528, 530, and 532. The vault logic can communicate with and control the vaults by way of the through silicon vias (TSV). The TSVs can provide a highly efficient technique for communicating from the vault logic to the memory layers within a hybrid memory cube.

Figure 6:
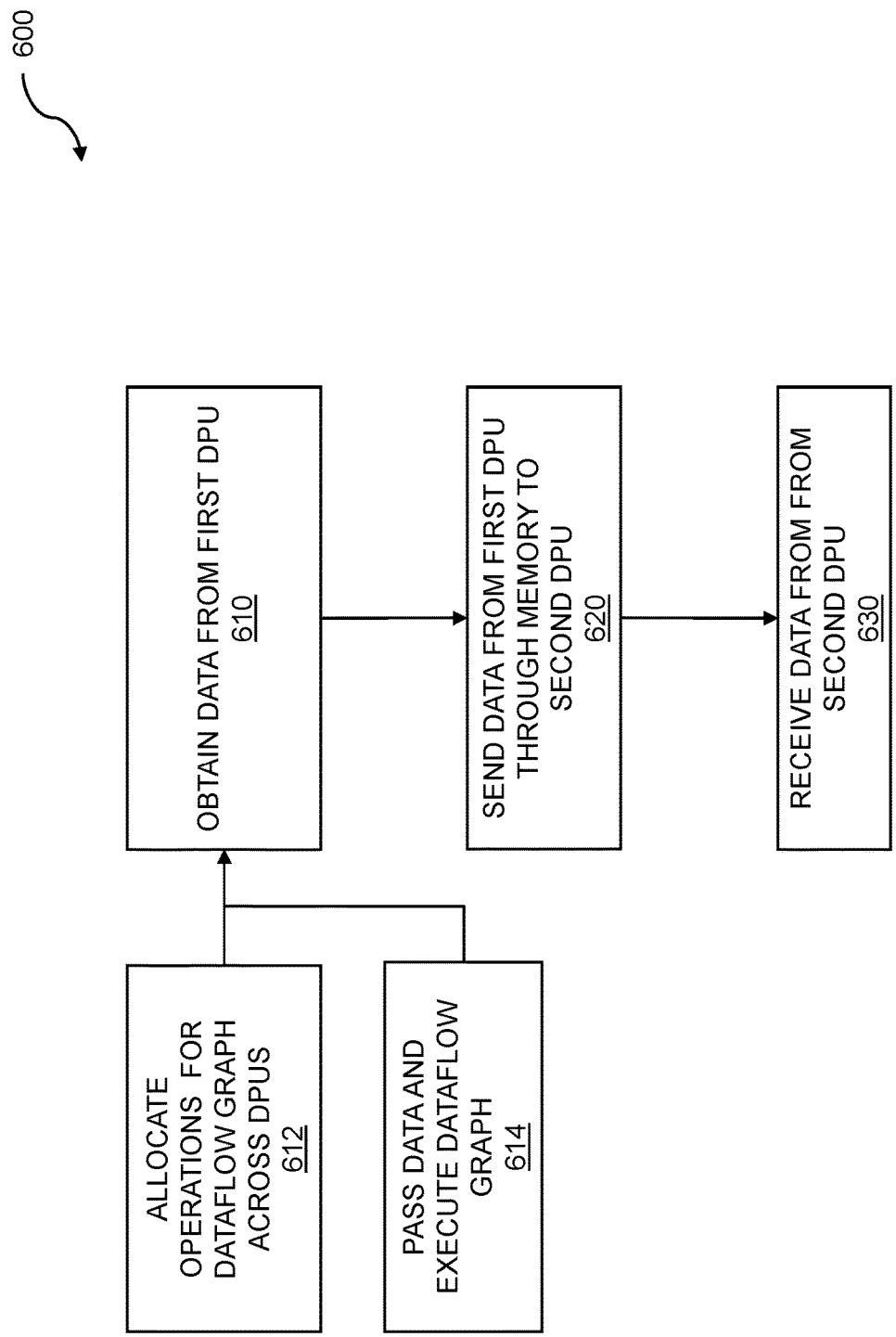
FIG. 6 is a flow diagram for communicating between dataflow processing units and memory.

FIG. 6 is a flow diagram for communicating between dataflow processing unit and memory. A first memory unit can be interposed between a first dataflow processing unit (DPU) and a second dataflow processing unit to improve communication between dataflow processing units and memories. Operations for a dataflow graph can be allocated across the first dataflow processing unit and the second dataflow processing unit. The first memory unit can pass data between the first dataflow processing unit and the second dataflow processing unit to execute the dataflow graph. The flow 600 begins with obtaining data from a first dataflow processing unit 610. The data that can be obtained can be raw data, model data, control data, intermediate data, and so on. The flow 600 includes allocating operations for a dataflow graph (DFG) 612 across the first dataflow processing unit and a second dataflow processing unit. The dataflow graph can describe how data that can be received at the inputs of one or more DPUs is to be processed. The DFG can be allocated across the first DPU and the second DPU based on available storage, DPU capabilities, DPU schedules, etc. The flow 600 includes the first memory unit passing data 614 between the first DPU and the second DPU and executing the DFG. The first memory unit can be a multiport memory, a high bandwidth memory, a hybrid cube memory, and so on. The flow 600 continues with sending the data from the first dataflow processing unit through a first memory unit interposed between the first dataflow processing unit and a second dataflow processing unit 620. The data that can be sent can be raw data, shared data, intermediate data, processed data, and so on. The flow 600 continues with receiving the data into the second dataflow processing unit 630. As before the received data can be raw data, shared data, intermediate data, processed data, etc.

Disclosed embodiments include a processor-implemented method for computation comprising: obtaining data from a first dataflow processing unit, wherein the first dataflow processing unit includes a plurality of circular buffers containing instructions to control dataflow; sending the data from the first dataflow processing unit through a first memory unit interposed between the first dataflow processing unit and a second dataflow processing unit wherein operations for a dataflow graph are allocated across the first dataflow processing unit and the second dataflow processing unit and wherein the first memory unit passes data between the first dataflow processing unit and the second dataflow processing unit to execute the dataflow graph; and receiving the data into the second dataflow processing unit. Various steps in the flow 600 may be changed in order, repeated, omitted, or the like without departing from the disclosed concepts. Various embodiments of the flow 600 can be included in a computer program product embodied in a non-transitory computer readable medium that includes code executable by one or more processors.

Figure 7:
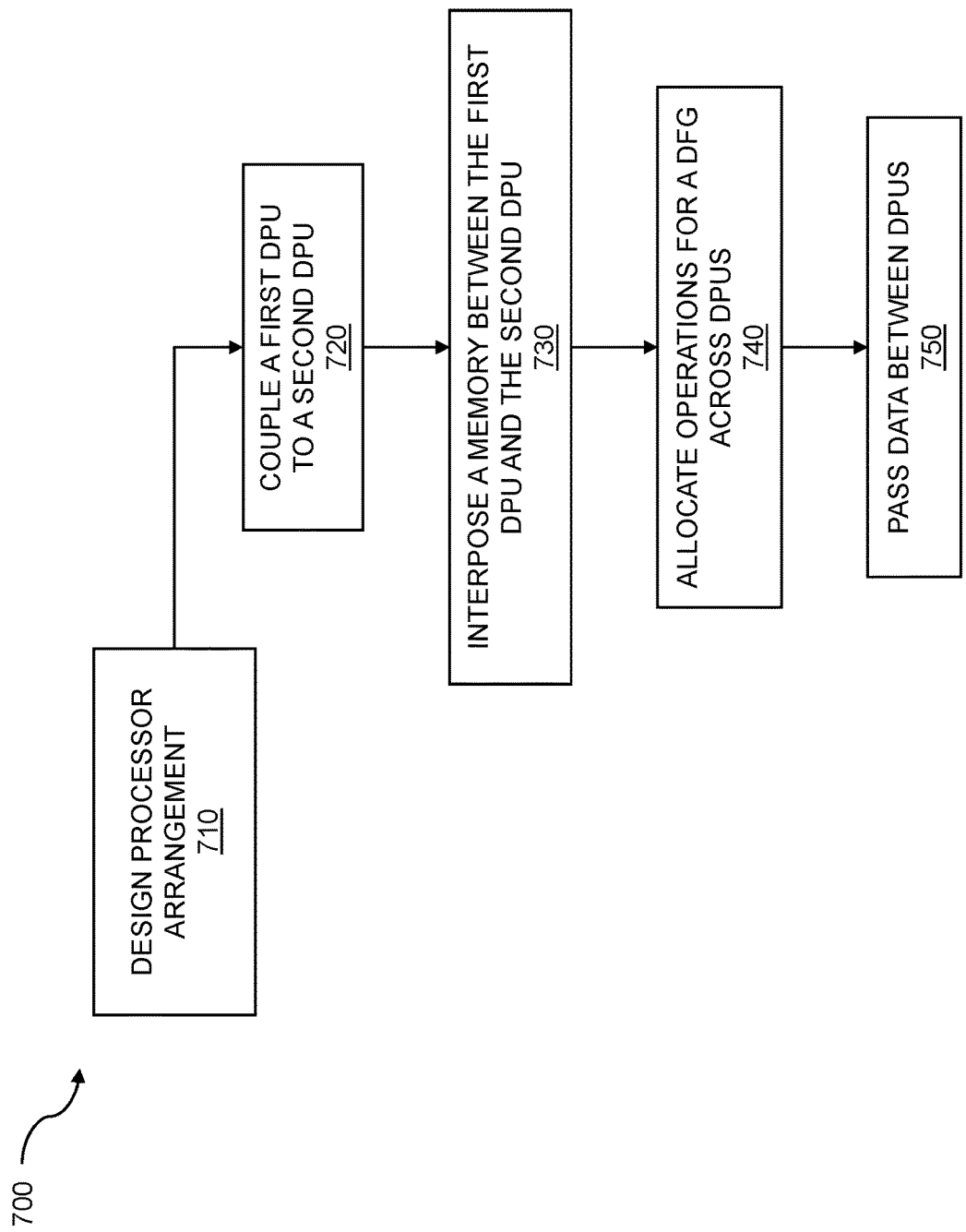
FIG. 7 is a flow diagram for implementing DPUs with HMCs.

FIG. 7 is a flow diagram for implementing DPUs with HMCs. A first memory unit can be interposed between a first dataflow processing unit and a second dataflow processing unit. Operations for a dataflow graph can be allocated across the first dataflow processing unit and the second dataflow processing unit. The first memory unit can pass data between the first dataflow processing unit and the second dataflow processing unit to execute the dataflow graph. The flow 700 begins with designing a processor arrangement 710. The processor arrangement can include one or more dataflow processing units, one or more high speed memories such as hybrid memory cubes, and so on. The flow 700 continues with coupling a first dataflow processing unit to a second dataflow processing unit 720. The dataflow processing units can process data based on the presence of data at the inputs of the one or more dataflow processing units. The flow 700 continues with interposing a first memory unit between the first dataflow processing unit and the second dataflow processing unit 730. The first memory unit can be a shared memory device such as a dual-port memory, a multiport memory, and so on. The first memory unit can include a high bandwidth memory, where the memory can be designed to read large amounts data, write large amounts of data, simultaneously read and write large amounts of data, etc. The first memory unit can include a hybrid memory cube. The flow 700 continues with allocating operations for a dataflow graph across dataflow processing units 740. The DFG can describe how data that is received at the inputs to one or more dataflow processing units can be processed. The flow 700 continues with passing data between dataflow processing units 750. That data that can be passed between the DPUs can include raw data, intermediate data, processed data, and so on, where the intermediate data and the processed data can be process based on the DFG.

Disclosed embodiments include a computer-implemented method for processing implementation comprising: designing a processor arrangement comprising: a first dataflow processing unit; a second dataflow processing unit; a first plurality of circular buffers, wherein the first plurality of circular buffers is included in the first dataflow processing unit and contains instructions for controlling data transfer between the first dataflow processing unit and the second dataflow processing unit; and a first memory unit interposed between the first dataflow processing unit and the second dataflow processing unit wherein operations for a dataflow graph are allocated across the first dataflow processing unit and the second dataflow processing unit and wherein the first memory unit passes data between the first dataflow processing unit and the second dataflow processing unit to execute the dataflow graph. Various steps in the flow 700 may be changed in order, repeated, omitted, or the like without departing from the disclosed concepts. Various embodiments of the flow 700 can be included in a computer program product embodied in a non-transitory computer readable medium that includes code executable by one or more processors.

Figure 8:
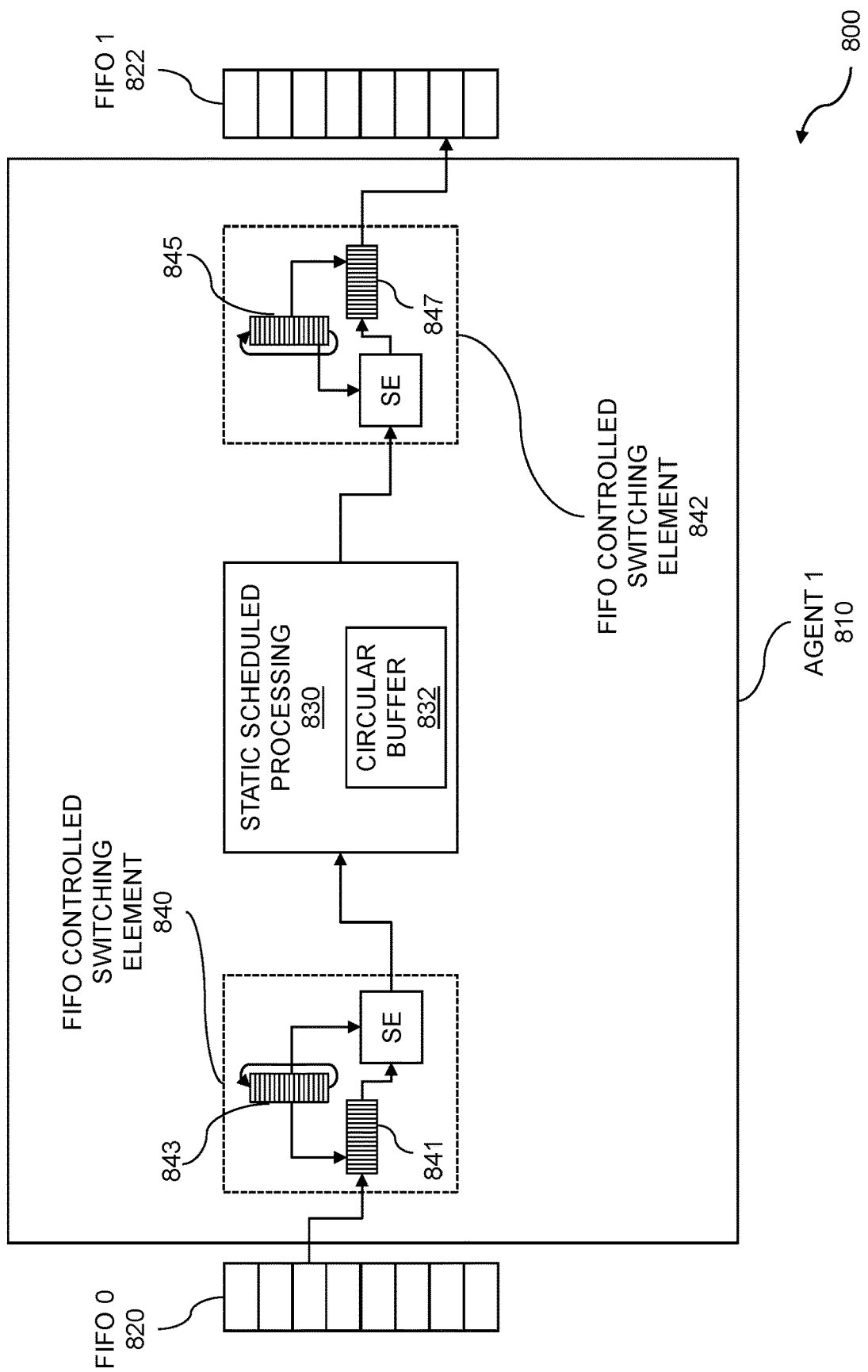
FIG. 8 shows scheduled sections relating to an agent.

FIG. 8 shows scheduled sections relating to an agent. In the example 800 shown, the scheduled selections relating to an agent can include remote usage of machine learned layers by a second machine learning construct. A first data group is collected in a first locality, and the first data group is applied to a first localized machine learning construct. A t set of convolutional layers is determined within the first localized machine learning construct based on the first data group where the first set of convolutional layers includes a first data flow graph machine. The first set of convolutional layers is sent to a second localized machine learning construct. The second localized machine learning construct can be similar to the first localized machine learning construct. A second data group is analyzed by the second machine learning construct using the first set of convolutional layers. A FIFO 820 serves as an input FIFO for a control agent 810. Data from FIFO 820 is read into local buffer 841 of FIFO controlled switching element 840. Circular buffer 843 may contain instructions that are executed by a switching element (SE), and may modify data based on one or more logical operations, including, but not limited to, XOR, OR, AND, NAND, and/or NOR. The plurality of processing elements can be controlled by circular buffers. The modified data may be passed to a circular buffer 832 under static scheduled processing 830. Thus, the scheduling of circular buffer 832 may be performed at compile time. The instructions loaded into circular buffer 832 may occur as part of a program initialization, and remain in the circular buffer 832 throughout the execution of the program (control agent). The circular buffer 832 may provide data to FIFO controlled switching element 842. Circular buffer 845 may rotate to provide a plurality of instructions/operations to modify and/or transfer data to data buffer 847, and is then transferred to external FIFO 822.

A process agent can include multiple components. An input component handles retrieval of data from an input FIFO. For example, agent 810 receives input from FIFO 820. An output component handles the sending of data to an output FIFO. For example, agent 810 provides data to FIFO 822. A signaling component can signal to process agents executing on neighboring processing elements about conditions of a FIFO. For example, a process agent can issue a FIRE signal to another process agent operating on another processing element when new data is available in a FIFO that was previously empty. Similarly, a process agent can issue a DONE signal to another process agent operating on another processing element when new space is available in a FIFO that was previously full. In this way, the process agent facilitates communication of data and FIFO states amongst neighboring processing elements to enable complex computations with multiple processing elements in an interconnected topology. An agent can comprise a forking agent, a joining agent, or the like.

Figure 9:
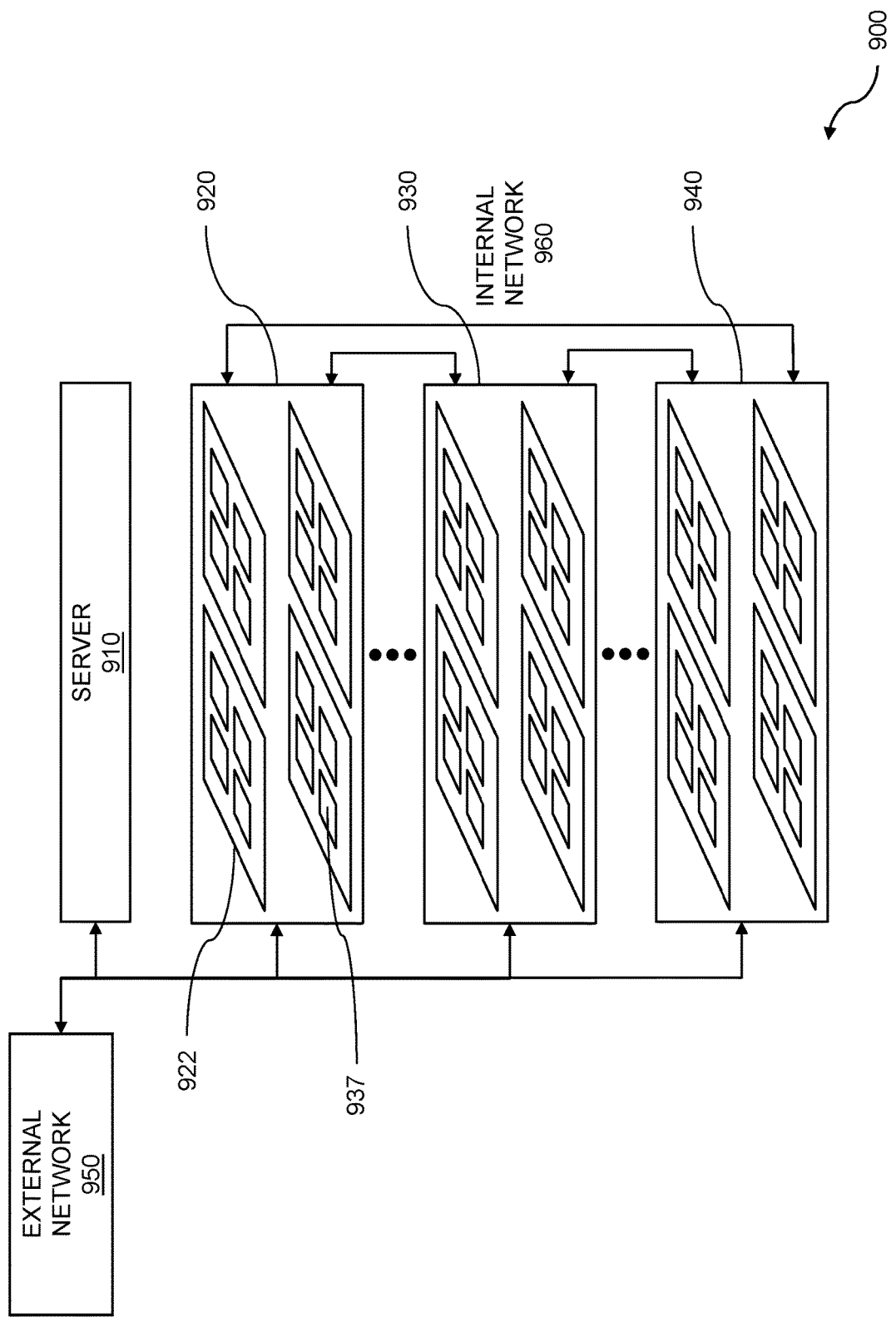
FIG. 9 illustrates a server allocating FIFOs and processing elements.

FIG. 9 illustrates a server allocating FIFOs and processing elements as part of implementing a dataflow graph. A system 900 can allocate one or more first-in first-outs (FIFOs) and processing elements (PEs) for remote usage of machine-learned layers by a second machine learning construct. A first data group is collected in a first locality. The first data group is applied to a first localized machine learning construct. The first learning construct can be a retail establishment, a vehicle, and so on. A first set of convolutional layers is determined within the first localized machine learning construct based on the first data group where the first set of convolutional layers includes a first data flow graph machine. The first set of convolutional layers is sent to a second localized machine learning construct. The second localized machine learning construct can be similar to the first localized machine learning construct. A second data group is analyzed by the second machine learning construct using the first set of convolutional layers. A system 900 can include a server 910 allocating FIFOs and processing elements. In embodiments, system 900 includes one or more boxes, indicated by callouts 920, 930, and 940. Each box may have one or more boards, indicated generally as 922. Each board comprises one or more chips, indicated generally as 937. Each chip may include one or more processing elements, where at least some of the processing elements may execute a process agent. An internal network 960 allows communication between the boxes such that processing elements on one box can provide and/or receive results from processing elements on another box.

The server 910 may be a computer executing programs on one or more processors based on instructions contained in a non-transitory computer readable medium. The server 910 may perform reconfiguring of a mesh networked computer system comprising a plurality of processing elements with a FIFO between one or more pairs of processing elements. In some embodiments, each pair of processing elements has a dedicated FIFO configured to pass data between the processing elements of the pair. The server 910 may receive instructions and/or input data from external network 950. The external network may provide information that includes, but is not limited to, hardware description language instructions (e.g. Verilog, VHDL, or the like), flow graphs, source code, or information in another suitable format.

The server 910 may collect performance statistics on the operation of the collection of processing elements. The performance statistics can include number of fork operations, join operations, average sleep time of a processing element, and/or a histogram of the sleep time of each processing element. Any outlier processing elements that sleep more than a predetermined threshold can be identified. In embodiments, the server can resize FIFOs or create new FIFOs to reduce the sleep time of a processing element that exceeds the predetermined threshold. Sleep time is essentially time when a processing element is not producing meaningful results, so it is generally desirable to minimize the amount of time a processing element spends in a sleep mode. In some embodiments, the server 910 may serve as an allocation manager to process requests for adding or freeing FIFOs, and/or changing the size of existing FIFOs in order to optimize operation of the processing elements.

In some embodiments, the server may receive optimization settings from the external network 950. The optimization settings may include a setting to optimize for speed, optimize for memory usage, or balance between speed and memory usage. Additionally, optimization settings may include constraints on the topology, such as a maximum number of paths that may enter or exit a processing element, maximum data block size, and other settings. Thus, the server 910 can perform a reconfiguration based on user-specified parameters via external network 950.

Figure 10:
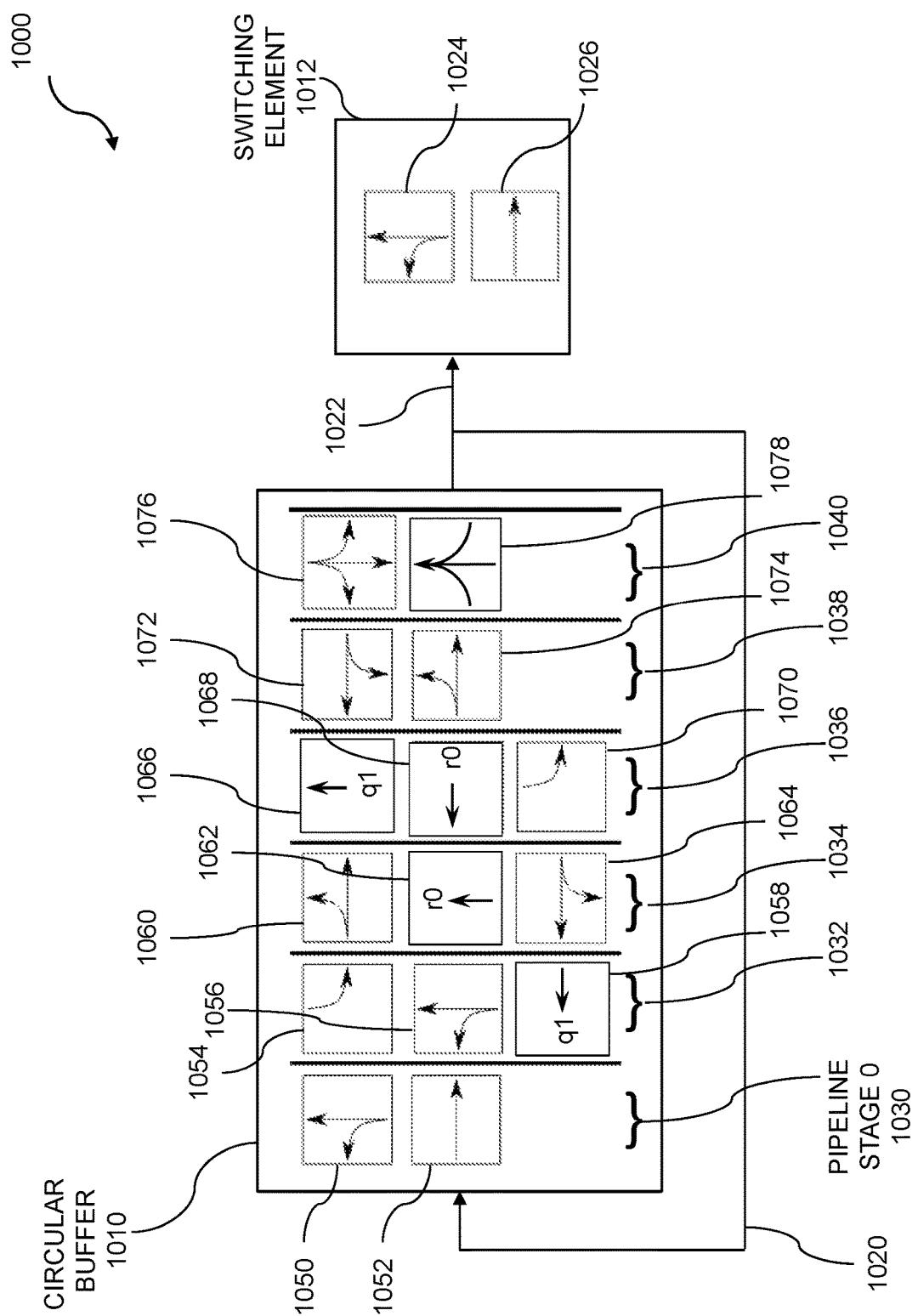
FIG. 10 is a block diagram of a circular buffer.

FIG. 10 is a block diagram 1000 of a circular buffer 1010 and a corresponding switching element 1012. The block diagram 1000 describes an apparatus for data manipulation. The circular buffer 1010 contains a plurality of pipeline stages. Each pipeline stage contains one or more instructions, up to a maximum instruction depth. In the embodiment shown in FIG. 10, the circular buffer 1010 is a 6×3 circular buffer, meaning that it implements a six-stage pipeline with an instruction depth of up to three instructions per stage (column). Hence, the circular buffer 1010 can include one, two, or three switch instruction entries per column. In some embodiments, the plurality of switch instructions per cycle can comprise two or three switch instructions per cycle. However, in certain embodiments, the circular buffer 1010 supports only a single switch instruction in a given cycle. In the example 1000 shown, Pipeline Stage 0 1030 has an instruction depth of two instructions 1050 and 1052. Though the remaining pipeline stages 1-5 are not textually labeled in the FIG. 1000, the stages are indicated by callouts 1032, 1034, 1036, 1038, and 1040. Pipeline stage 1 1032 has an instruction depth of three instructions 1054, 1056, and 1058. Pipeline stage 2 1034 has an instruction depth of three instructions 1060, 1062, and 1064. Pipeline stage 3 1036 also has an instruction depth of three instructions 1066, 1068, and 1070. Pipeline stage 4 1038 has an instruction depth of two instructions 1072 and 1074. Pipeline stage 5 1040 has an instruction depth of two instructions 1076 and 1078. In embodiments, the circular buffer 1010 includes 64 columns.

During operation, the circular buffer 1010 rotates through configuration instructions. The circular buffer 1010 can dynamically change operation of the logical elements based on the rotation of the circular buffer. The circular buffer 1010 can comprise a plurality of switch instructions per cycle for the configurable connections.

The instruction 1052 is an example of a switch instruction. In embodiments, each cluster has four inputs and four outputs, each designated within the cluster's nomenclature as "north," "east," "south," and "west" respectively. For example, the instruction 1052 in the block diagram 1000 is a west-to-east transfer instruction. The instruction 1052 directs the cluster to take data on its west input and send out the data on its east output. In another example of data routing, the instruction 1050 is a fan-out instruction. The instruction 1050 instructs the cluster to take data on its south input and send out on the data on both its north output and its west output. The arrows within each instruction box indicate the source and destination of the data. The instruction 1078 is an example of a fan-in instruction. The instruction 1078 takes data from the west, south, and east inputs and sends out the data on the north output. Therefore, the configurable connections can be considered to be time multiplexed.

In embodiments, the clusters implement multiple storage elements in the form of registers. In the example 1000 shown, the instruction 1062 is a local storage instruction. The instruction 1062 takes data from the instruction's south input and stores it in a register (r0). The instruction 1068 is a retrieval instruction. The instruction 1068 takes data from the register (r0) and outputs it on the instruction's west output. Some embodiments utilize four general purpose registers, referred to as registers r0, r1, r2, and r3. The registers are, in embodiments, storage elements which store data while the configurable connections are busy with other data. In embodiments, the storage elements are 32-bit registers. In other embodiments, the storage elements are 64-bit registers. Other register widths are possible.

In embodiments, the clusters implement multiple processing elements in the form of processor cores, referred to as cores q0, q1, q2, and q3. In embodiments, four cores are used, though any number of cores can be implemented. The instruction 1058 is a processing instruction. The instruction 1058 takes data from the instruction's east input and sends it to a processor q1 for processing. The processors can perform logic operations on the data, including, but not limited to, a shift operation, a logical AND operation, a logical OR operation, a logical NOR operation, a logical XOR operation, an addition, a subtraction, a multiplication, and a division. Thus, the configurable connections can comprise one or more of a fan-in, a fan-out, or a local storage.

In the example 1000 shown, the circular buffer 1010 rotates instructions in each pipeline stage into switching element 1012 via a forward data path 1022, and also back to a pipeline stage 0 1030 via a feedback data path 1020. Instructions can include switching instructions, storage instructions, and processing instructions, among others. The feedback data path 1020 can allow instructions within the switching element 1012 to be transferred back to the circular buffer. Hence, the instructions 1024 and 1026 in the switching element 1012 can also be transferred back to pipeline stage 0 as the instructions 1050 and 1052. In addition to the instructions depicted on FIG. 10, a no-op instruction or a sleep instruction can also be inserted into a pipeline stage. In embodiments, a no-op instruction causes execution to not be performed for a given cycle. In effect, the introduction of a no-op instruction can cause a column within the circular buffer 1010 to be skipped in a cycle. In contrast, not skipping an operation indicates that a valid instruction is being pointed to in the circular buffer. A sleep state can be accomplished by not applying a clock to a circuit, performing no processing within a processor, removing a power supply voltage or bringing a power supply to ground, storing information into a non-volatile memory for future use and then removing power applied to the memory, or by similar techniques. A sleep instruction that causes no execution to be performed until a predetermined event occurs which causes the logical element to exit the sleep state can also be explicitly specified. The predetermined event can be the arrival or availability of valid data. The data can be determined to be valid using null convention logic (NCL). In embodiments, only valid data can flow through the switching elements and Xs (invalid data points) are not propagated by instructions.

In some embodiments, the sleep state is exited based on an instruction applied to a switching fabric. The sleep state can, in some embodiments, only be exited by stimulus external to the logical element and not based on the programming of the logical element. The external stimulus can include an input signal, which in turn can cause a wake up or an interrupt service request to execute on one or more of the logical elements. An example of such a wake up request can be seen in the instruction 1058, assuming that the processor q1 was previously in a sleep state. In embodiments, when the instruction 1058 takes valid data from the east input and applies that data to the processor q1, the processor q1 wakes up and operates on the received data. In the event that the data is not valid, the processor q1 can remain in a sleep state. At a later time, data can be retrieved from the q1 processor, e.g. by using an instruction such as the instruction 1066. In the case of the instruction 1066, data from the processor q1 is moved to the north output. In some embodiments, if Xs have been placed into the processor q1, such as during the instruction 1058, then Xs would be retrieved from the processor q1 during the execution of the instruction 1066 and applied to the north output of the instruction 1066. In embodiments, the processing element wakes up from the sleep state when valid data is applied to inputs of the processing element.

A collision occurs if multiple instructions route data to a particular port in a given pipeline stage at the same time. For example, if instructions 1052 and 1054 are in the same pipeline stage, they will both send data to the east output at the same time, thus causing a collision since neither instruction is part of a time-multiplexed fan-in instruction (such as the instruction 1078). To avoid potential collisions, certain embodiments use preprocessing, such as by a compiler, to arrange the instructions in such a way that there are no collisions when the instructions are loaded into the circular buffer. In embodiments, the preprocessing can insert further instructions to prevent collisions. Thus, the circular buffer 1010 can be statically scheduled in order to prevent data collisions. In embodiments, when the preprocessor detects a data collision, the scheduler changes the order of the instructions to prevent the collision. Alternatively or additionally, the preprocessor can insert further instructions such as storage instructions (e.g. the instruction 1062), sleep instructions, or no-op instructions, to prevent the collision. Alternatively or additionally, the preprocessor can replace multiple instructions with a single fan-in instruction. For example, if a first instruction sends data from the south input to the north output and a second instruction sends data from the west input to the north output in the same pipeline stage, the first and second instruction can be replaced with a fan-in instruction that routes the data from both of those inputs to the north output in a deterministic way to avoid a data collision. In this case, the machine can guarantee that valid data is only applied on one of the inputs for the fan-in instruction.

Figure 11:
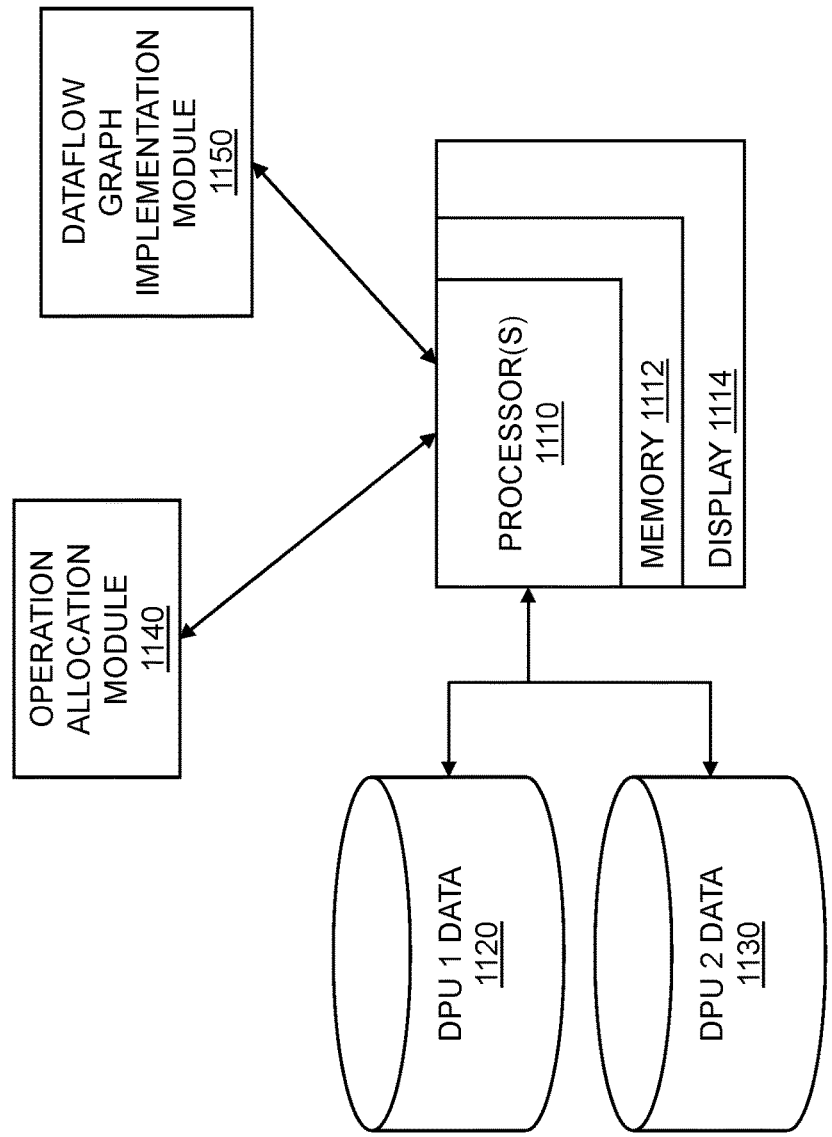
FIG. 11 is a system for implementing DPUs with HMCs.

FIG. 11 is a system for implementing DPUs with HMCs. The system 1100 can include one or more processors 1110 coupled to a memory 1112 which stores instructions. The system 1100 can include a display 1114 coupled to the one or more processors 1110 for displaying data, dataflow graphs, intermediate steps, instructions, and so on. The one or more processors 1110, when executing the instructions which are stored, are configured to design a processor arrangement comprising: a first dataflow processing unit; a second dataflow processing unit; and a first memory unit interposed between the first dataflow processing unit and the second dataflow processing unit. An operation allocation module 1140 allocates operations for a dataflow graph across the first dataflow processing unit and the second dataflow processing unit. A dataflow execution module 1150 executes the operations of the dataflow graph that is allocated across the first dataflow processing unit and the second dataflow processing unit. The first memory unit passes dataflow processing unit data 1120 between the first dataflow processing unit and the second dataflow processing unit, dataflow processing unit data 1130, to execute the dataflow graph. In embodiments, a system for computation comprising: a memory which stores instructions; one or more processors coupled to the memory wherein the one or more processors, when executing the instructions which are stored, are configured to: design a processor arrangement comprising: a first dataflow processing unit; a second dataflow processing unit; a first plurality of circular buffers, wherein the first plurality of circular buffers is included in the first dataflow processing unit and contains instructions for controlling data transfer between the first dataflow processing unit and the second dataflow processing unit; and a first memory unit interposed between the first dataflow processing unit and the second dataflow processing unit wherein operations for a dataflow graph are allocated across the first dataflow processing unit and the second dataflow processing unit and wherein the first memory unit passes data between the first dataflow processing unit and the second dataflow processing unit to execute the dataflow graph.

In embodiments, a computer program product is embodied in a non-transitory computer readable medium for computation. The computer program product comprises code which causes one or more processors to perform operations of: designing a processor arrangement comprising: designing a processor arrangement comprising: a first dataflow processing unit; a second dataflow processing unit; a first plurality of circular buffers, wherein the first plurality of circular buffers is included in the first dataflow processing unit and contains instructions for controlling data transfer between the first dataflow processing unit and the second dataflow processing unit; and a first memory unit interposed between the first dataflow processing unit and the second dataflow processing unit wherein operations for a dataflow graph are allocated across the first dataflow processing unit and the second dataflow processing unit and wherein the first memory unit passes data between the first dataflow processing unit and the second dataflow processing unit to execute the dataflow graph.

Each of the above methods may be executed on one or more processors on one or more computer systems. Embodiments may include various forms of distributed computing, client/server computing, and cloud based computing. Further, it will be understood that the depicted steps or boxes contained in this disclosure's flow charts are solely illustrative and explanatory. The steps may be modified, omitted, repeated, or re-ordered without departing from the scope of this disclosure. Further, each step may contain one or more sub-steps. While the foregoing drawings and description set forth functional aspects of the disclosed systems, no particular implementation or arrangement of software and/or hardware should be inferred from these descriptions unless explicitly stated or otherwise clear from the context. All such arrangements of software and/or hardware are intended to fall within the scope of this disclosure.

The block diagrams and flowchart illustrations depict methods, apparatus, systems, and computer program products. The elements and combinations of elements in the block diagrams and flow diagrams, show functions, steps, or groups of steps of the methods, apparatus, systems, computer program products and/or computer-implemented methods. Any and all such functions—generally referred to herein as a "circuit," "module," or "system"—may be implemented by computer program instructions, by special-purpose hardware-based computer systems, by combinations of special purpose hardware and computer instructions, by combinations of general purpose hardware and computer instructions, and so on.

A programmable apparatus which executes any of the above-mentioned computer program products or computer-implemented methods may include one or more microprocessors, microcontrollers, embedded microcontrollers, programmable digital signal processors, programmable devices, programmable gate arrays, programmable array logic, memory devices, application specific integrated circuits, or the like. Each may be suitably employed or configured to process computer program instructions, execute computer logic, store computer data, and so on.

It will be understood that a computer may include a computer program product from a computer-readable storage medium and that this medium may be internal or external, removable and replaceable, or fixed. In addition, a computer may include a Basic Input/Output System (BIOS), firmware, an operating system, a database, or the like that may include, interface with, or support the software and hardware described herein.

Embodiments of the present invention are neither limited to conventional computer applications nor the programmable apparatus that run them. To illustrate: the embodiments of the presently claimed invention could include an optical computer, quantum computer, analog computer, or the like. A computer program may be loaded onto a computer to produce a particular machine that may perform any and all of the depicted functions. This particular machine provides a technique for carrying out any and all of the depicted functions.

Any combination of one or more computer readable media may be utilized including but not limited to: a non-transitory computer readable medium for storage; an electronic, magnetic, optical, electromagnetic, infrared, or semiconductor computer readable storage medium or any suitable combination of the foregoing; a portable computer diskette; a hard disk; a random access memory (RAM); a read-only memory (ROM), an erasable programmable read-only memory (EPROM, Flash, MRAM, FeRAM, or phase change memory); an optical fiber; a portable compact disc; an optical storage device; a magnetic storage device; or any suitable combination of the foregoing. In the context of this document, a computer readable storage medium may be any tangible medium that can contain or store a program for use by or in connection with an instruction execution system, apparatus, or device.

It will be appreciated that computer program instructions may include computer executable code. A variety of languages for expressing computer program instructions may include without limitation C, C++, Java, JavaScript™, ActionScript™, assembly language, Lisp, Perl, Tcl, Python, Ruby, hardware description languages, database programming languages, functional programming languages, imperative programming languages, and so on. In embodiments, computer program instructions may be stored, compiled, or interpreted to run on a computer, a programmable data processing apparatus, a heterogeneous combination of processors or processor architectures, and so on. Without limitation, embodiments of the present invention may take the form of web-based computer software, which includes client/server software, software-as-a-service, peer-to-peer software, or the like.

In embodiments, a computer may enable execution of computer program instructions including multiple programs or threads. The multiple programs or threads may be processed approximately simultaneously to enhance utilization of the processor and to facilitate substantially simultaneous functions. By way of implementation, any and all methods, program codes, program instructions, and the like described herein may be implemented in one or more threads which may in turn spawn other threads, which may themselves have priorities associated with them. In some embodiments, a computer may process these threads based on priority or other order.

Unless explicitly stated or otherwise clear from the context, the verbs "execute" and "process" may be used interchangeably to indicate execute, process, interpret, compile, assemble, link, load, or a combination of the foregoing. Therefore, embodiments that execute or process computer program instructions, computer-executable code, or the like may act upon the instructions or code in any and all of the ways described. Further, the method steps shown are intended to include any suitable method of causing one or more parties or entities to perform the steps. The parties performing a step, or portion of a step, need not be located within a particular geographic location or country boundary. For instance, if an entity located within the United States causes a method step, or portion thereof, to be performed outside of the United States then the method is considered to be performed in the United States by virtue of the causal entity.

While the invention has been disclosed in connection with preferred embodiments shown and described in detail, various modifications and improvements thereon will become apparent to those skilled in the art. Accordingly, the forgoing examples should not limit the spirit and scope of the present invention; rather it should be understood in the broadest sense allowable by law.

What is claimed is:

1. An apparatus for computation comprising:
   a first dataflow processing unit;
   a second dataflow processing unit;
   a first plurality of circular buffers, wherein the first plurality of circular buffers is included in the first dataflow processing unit and contains instructions for controlling data transfer between the first dataflow processing unit and the second dataflow processing unit; and
   a first memory unit interposed between the first dataflow processing unit and the second dataflow processing unit wherein operations for a dataflow graph are allocated across the first dataflow processing unit and the second dataflow processing unit and wherein the first memory unit passes data between the first dataflow processing unit and the second dataflow processing unit to execute the dataflow graph.

2. The apparatus of claim 1 wherein the first memory unit comprises a shared memory device.

3. The apparatus of claim 1 wherein the first memory unit comprises a hybrid memory cube.

4. The apparatus of claim 1 wherein the second dataflow processing unit comprises a second plurality of circular buffers containing instructions for controlling data transfer between the first dataflow processing unit and the second dataflow processing unit using the first memory unit.

5. The apparatus of claim 1 wherein the first dataflow processing unit is coupled to the first memory unit via a first link.

6. The apparatus of claim 5 wherein the first link accesses a plurality of FIFOs within the first memory unit.

7. The apparatus of claim 6 wherein the plurality of FIFOs is configured using DRAM memory.

8. The apparatus of claim 7 wherein the plurality of FIFOs each have an address pointer to sequence through a FIFO from the plurality of FIFOs.

9. The apparatus of claim 6 wherein the plurality of FIFOs is statically defined.

10. The apparatus of claim 9 wherein definition for the plurality of FIFOs is accomplished at compile time based on the dataflow graph.

11. The apparatus of claim 5 wherein the first dataflow processing unit uses a write port within the first link to send data to the first memory unit.

12. The apparatus of claim 1 wherein the second dataflow processing unit is coupled to the first memory unit via a second link.

13. The apparatus of claim 12 wherein the second dataflow processing unit uses a read port within the second link to receive data from the first memory unit.

14. The apparatus of claim 12 wherein the second link accesses a plurality of FIFOs within the first memory unit.

15. The apparatus of claim 1 further comprising a third dataflow processing unit coupled to the first memory unit wherein the third dataflow processing unit accesses the first memory unit through a third link.

16. The apparatus of claim 15 further comprising a fourth dataflow processing unit coupled to the first memory unit wherein the fourth dataflow processing unit accesses the first memory unit through a fourth link.

17. The apparatus of claim 1 further comprising a second memory unit interposed between the first dataflow processing unit and the second dataflow processing unit.

18. The apparatus of claim 17 further comprising a third memory unit interposed between the first dataflow processing unit and the second dataflow processing unit.

19. The apparatus of claim 18 further comprising a fourth memory unit interposed between the first dataflow processing unit and the second dataflow processing unit.

20. The apparatus of claim 19 further comprising a third dataflow processing unit and a fourth dataflow processing unit.

21. The apparatus of claim 20 wherein each of the first memory unit, the second memory unit, the third memory unit, and the fourth memory unit access each of the first dataflow processing unit, the second dataflow processing unit, the third dataflow processing unit, and the fourth dataflow processing unit on different links.

22. The apparatus of claim 1 wherein the first dataflow processing unit, the second dataflow processing unit, and the first memory unit comprise a deep learning machine.

23. A processor-implemented method for computation comprising:
  obtaining data from a first dataflow processing unit, wherein the first dataflow processing unit includes a plurality of circular buffers containing instructions to control dataflow;
  sending the data from the first dataflow processing unit through a first memory unit interposed between the first dataflow processing unit and a second dataflow processing unit wherein operations for a dataflow graph are allocated across the first dataflow processing unit and the second dataflow processing unit and wherein the first memory unit passes data between the first dataflow processing unit and the second dataflow processing unit to execute the dataflow graph; and
  receiving the data into the second dataflow processing unit.

* * * * *